(12) United States Patent
Ando et al.

(10) Patent No.: US 11,515,214 B2
(45) Date of Patent: *Nov. 29, 2022

(54) THRESHOLD VOLTAGE ADJUSTMENT BY INNER SPACER MATERIAL SELECTION

(71) Applicant: INTERNATIONAL BUSINESS MACHINES CORPORATION, Armonk, NY (US)

(72) Inventors: Takashi Ando, Eastchester, NY (US); Jingyun Zhang, Albany, NY (US); Choonghyun Lee, Chigasaki (JP); Pouya Hashemi, Purchase, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 7 days.

This patent is subject to a terminal disclaimer.

(21) Appl. No.: 17/232,295

(22) Filed: Apr. 16, 2021

(65) Prior Publication Data
US 2021/0233818 A1    Jul. 29, 2021

Related U.S. Application Data

(63) Continuation of application No. 16/425,398, filed on May 29, 2019, now Pat. No. 11,037,832.

(51) Int. Cl.
*H01L 21/8234* (2006.01)
*H01L 27/088* (2006.01)

(52) U.S. Cl.
CPC ........ *H01L 21/823468* (2013.01); *H01L 21/823431* (2013.01); *H01L 27/0886* (2013.01)

(58) Field of Classification Search
CPC ..... H01L 21/823468; H01L 21/823431; H01L 27/0886
USPC ........................................................ 257/392
See application file for complete search history.

(56) References Cited

U.S. PATENT DOCUMENTS

| | | |
|---|---|---|
| 7,838,908 B2 | 11/2010 | Kwon et al. |
| 9,741,814 B2 | 8/2017 | Matsumoto |
| 9,786,761 B2 | 10/2017 | Lee et al. |
| 9,991,261 B2 | 6/2018 | Mitard |
| 10,008,583 B1 | 6/2018 | Rodder et al. |
| 10,043,881 B2 | 8/2018 | Yamamoto |

(Continued)

OTHER PUBLICATIONS

Young-Hee Kim et al., "Novel Single Metal Gate CMOS Integration with Effective Workfunction Modulation by a Differential Spacer: Manipulation of Oxygen Vacancy", Extended Abstracts of the 2009 International Conference on Solid State Devices and Materials, Sendai, Oct. 2009, pp. 1034-1035.

(Continued)

*Primary Examiner* — Igwe U Anya
(74) *Attorney, Agent, or Firm* — Tutunjian & Bitetto, P.C.; Robert Sullivan

(57) ABSTRACT

Semiconductor devices and methods of forming the same include forming first recesses in a first stack of alternating sacrificial layers and channel layers. A first inner spacer sub-layer is formed in the first recesses from a first dielectric material. A second inner spacer sub-layer is formed in the first recesses from a second dielectric material, different from the first dielectric material. The sacrificial layers and the first inner spacer sub-layer are replaced with a gate stack in contact with the second inner spacer sub-layer.

14 Claims, 8 Drawing Sheets

(56) References Cited

U.S. PATENT DOCUMENTS

| | | |
|---|---|---|
| 10,074,575 B1* | 9/2018 | Guillorn ......... H01L 21/823821 |
| 11,037,832 B2* | 6/2021 | Ando ................ H01L 29/78696 |
| 2018/0175167 A1 | 6/2018 | Reboh et al. |
| 2020/0066894 A1* | 2/2020 | Frougier ............. H01L 29/0847 |
| 2020/0152734 A1* | 5/2020 | Frougier ............. H01L 29/0649 |

OTHER PUBLICATIONS

C-H. Lin et al., "High Performance 14nm SOI FinFET CMOS Technology with 0.0174μm2 embedded DRAM and 15 Levels of Cu Metallization", 2014 IEEE International Electron Devices Meeting, San Francisco, CA, Dec. 2014.

S. Barraud et al., "Vertically Stacked-NanoWires MOSFETs in a Replacement Metal Gate Process with Inner Spacer and SiGe Source/Drain", 2016 IEEE International Electron Devices Meeting (IEDM), San Francisco, CA, Dec. 2016.

List of IBM Patents or Patent Applications Treated as Related dated Apr. 16, 2021, 2 pages.

\* cited by examiner

THRESHOLD VOLTAGE ADJUSTMENT BY INNER SPACER MATERIAL SELECTION

BACKGROUND

The present invention generally relates to semiconductor fabrication and, more particularly, to the adjustment of transistor threshold voltage using inner spacer material selection.

Tuning the threshold voltage of a fully depleted semiconductor device architecture, for example including fin field effect transistors and nanosheet field effect transistors, is useful to take advantage of high mobility and small device variability that results from the absence of channel doping. Different gate stacks can use different work function materials to select different electrical properties in the final device. However, using different work function materials generally involves patterning after deposition of the gate dielectric to pattern the work function materials. For nanosheet devices, it can be particularly challenging to perform these patterning steps because the limited space between nanosheets can lead to pinch-off in the small gaps that is difficult to remove.

SUMMARY

A method of forming a semiconductor device includes forming first recesses in a first stack of alternating sacrificial layers and channel layers. A first inner spacer sub-layer is formed in the first recesses from a first dielectric material. A second inner spacer sub-layer is formed in the first recesses from a second dielectric material, different from the first dielectric material. The sacrificial layers and the first inner spacer sub-layer are replaced with a gate stack in contact with the second inner spacer sub-layer.

An integrated chip includes a first semiconductor device and a second semiconductor device. The first semiconductor device includes first inner spacers between respective pairs of first channel layers, formed from a single layer of dielectric material, and a first gate stack in contact with the first channel layers and the first inner spacers. The second semiconductor device includes second inner spacers between respective pairs of second channel layers, formed from layers of differing dielectric materials, and a second gate stack in contact with the second channel layers and the second inner spacers.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide control over semiconductor device threshold voltages using high-k gate dielectric materials in contact with inner spacers of varying materials. In particular, by putting an oxide inner spacer in contact with the gate dielectric instead of a silicon nitride inner spacer, the present embodiments provide the ability to tune the voltage threshold of the final devices by filling oxygen vacancies within the gate dielectric.

Figure 1:
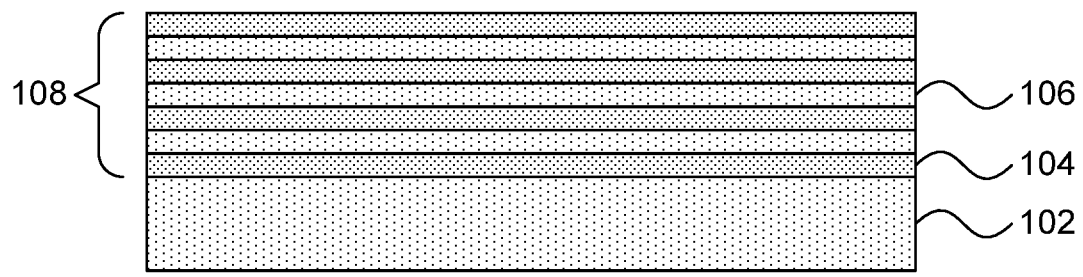
FIG. 1 is a cross-sectional view of a step in a method of forming nanosheet devices that employ inner spacers with varying materials, to tune the threshold voltage of the device, that shows the formation of a stack of alternating semiconductor layers in accordance with an embodiment of the present invention.

Referring now to the drawings in which like numerals represent the same or similar elements and initially to FIG. 1, a cross-sectional diagram of a step in forming nanosheet field effect transistors (FETs) having different threshold voltages is shown. A semiconductor substrate 102 is provided. The semiconductor substrate 102 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted herein, the semiconductor substrate 102 may also be a semiconductor on insulator (SOI) substrate.

A stack of alternating semiconductor layers 108 is formed on the semiconductor substrate 102. Layers of a sacrificial material 104 alternate with layers of a channel material 106. The sacrificial and channel materials have etch selectivity with respect to one another. As used herein, the term "selective" in reference to a material removal process denotes that the rate of material removal for a first material is greater than the rate of removal for at least another material of the structure to which the material removal process is being applied. In one specific embodiment, etch selectivity denotes a ratio of etch rates between an etched material and other materials of at least 10:1.

In one specific embodiment, the sacrificial layers 104 are formed from silicon germanium and the channel layers 106 are formed from silicon. These two materials have etch selectivity with respect to one another, such that the material of one set of layers can be removed without substantially affecting the material of the other layers. It should be understood, however, that any appropriate combination of semiconductor materials having etch selectivity with respect to one another may be used instead. In some embodiments, the stack 108 can be etched to form a fin or other structure. In such embodiments, the present depictions show a cross-section that runs parallel to the fin, with the sacrificial layers 104 and the channel layers 106 forming nanowires or nanosheets. In further embodiments, the stack of layers 108 can be formed on an electrically insulating isolation layer, instead of directly on the substrate 102.

The stack of alternating semiconductor layers 108 may be formed by any appropriate deposition process. It is specifically contemplated that the alternating semiconductor layers 108 can be grown from the substrate 102 and from one another by epitaxial growth processes, but other embodiments may use chemical vapor deposition (CVD), atomic layer deposition (CVD), physical vapor deposition (PVD), or gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Figure 2:
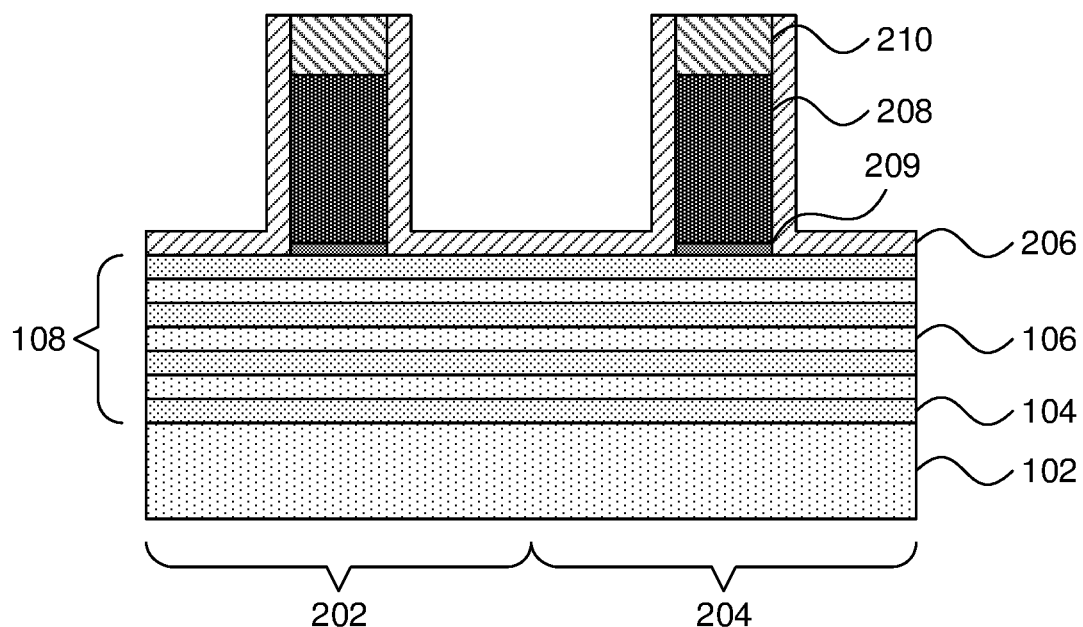
FIG. 2 is a cross-sectional view of a step in a method of forming nanosheet devices that employ inner spacers with varying materials, to tune the threshold voltage of the device, that shows the formation of dummy gate structures on the stack in accordance with an embodiment of the present invention.

Referring now to FIG. 2, a cross-sectional diagram of a step in forming nanosheet FETs having different threshold voltages is shown. The figure depicts a first region 202 and a second region 204. It should be understood that these two regions are formed on a single wafer and may be separated by a substantial distance. The two regions 202 and 204 are indicated separately to show different inner spacer structures, which result in different device characteristics.

Dummy gates 208 are formed in the respective regions and may be formed from any appropriate material such as, e.g., polysilicon or amorphous silicon and are separated from the underlying stack of alternating semiconductor layers 108 by an insulator pad 209. The dummy gates 208 are surrounded by an insulator layer formed from, e.g., a gate pattern hardmask 210 and a spacer 206. It is specifically contemplated that the gate pattern hardmask 210 may be formed from any appropriate hardmask material such as, e.g., silicon nitride, and that the spacer 206 may be formed from any appropriate dielectric material including, e.g., silicon boron carbon nitride, that is selectively etchable with respect to silicon nitride.

The dummy gates 208 may be formed by depositing a dielectric hard mask material, such as silicon nitride or silicon dioxide, on a layer of dummy gate material and then applying a photoresist pattern to the hard mask material using a lithography process. The photoresist pattern is then transferred into the hard mask material using, e.g., a dry etch process to form the gate pattern hardmask 210. Next, the photoresist pattern is removed and the gate pattern is then transferred into the dummy gate material during an anisotropic selective etching process, such as reactive ion etching (RIE).

RIE is a form of plasma etching in which during etching the surface to be etched is placed on a radio-frequency powered electrode. During RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

Figure 3:
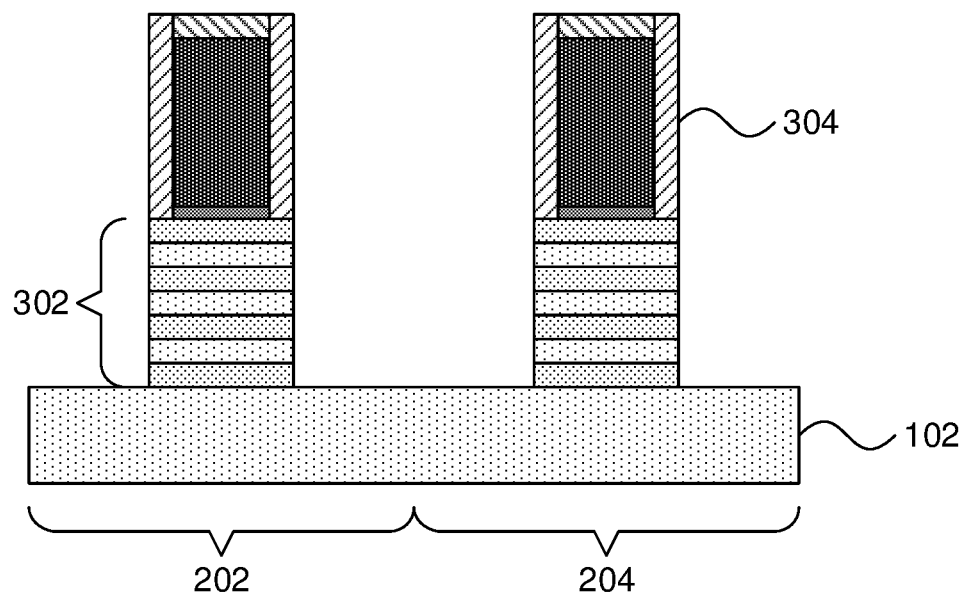
FIG. 3 is a cross-sectional view of a step in a method of forming nanosheet devices that employ inner spacers with varying materials, to tune the threshold voltage of the device, that shows etching the stack using the dummy gate structures as a mask in accordance with an embodiment of the present invention.

Referring now to FIG. 3, a cross-sectional diagram of a step in forming nanosheet FETs having different threshold voltages is shown. One or more anisotropic etches are applied that stop on the substrate 102. The anisotropic etches should remove material from the spacer 206, such that they can penetrate to the underlying stack of alternating semiconductor layers 108.

It is specifically contemplated that RIE may be used to perform the anisotropic etch. In one specific embodiment, multiple different etches may be used, with a first etch anisotropically removing material around the thicker gate pattern hardmask 206 and vertical spacer, followed by a second etch (which may include a set of alternating etches) that is selective to the materials of the stack 108 without affecting the remaining hardmask materials. What remains is etched channel stacks 302 in the first regions 202 and the second regions 204, with the etched channel stacks 302 extending no farther than the remaining gate spacers 304.

Figure 4:
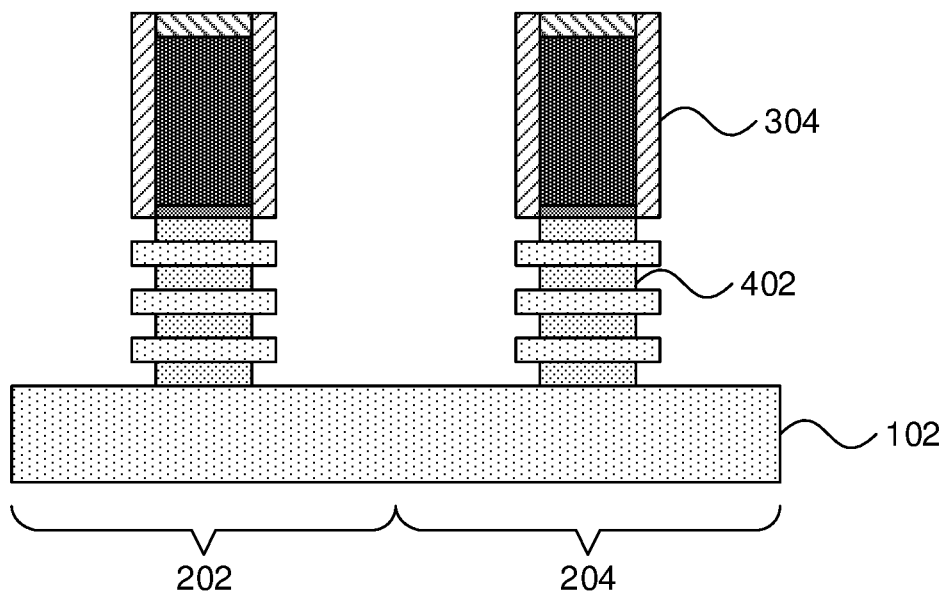
FIG. 4 is a cross-sectional view of a step in a method of forming nanosheet devices that employ inner spacers with varying materials, to tune the threshold voltage of the device, that shows recessing sacrificial layers in the stack in accordance with an embodiment of the present invention.

Referring now to FIG. 4, a cross-sectional diagram of a step in forming nanosheet FETs having different threshold voltages is shown. An isotropic etch is used to laterally etch the sacrificial layers 104. The etch selectively removes material from the sacrificial layers 104 and leaves the material of the channel layers 106 in place, leaving etched sacrificial layers 402.

Figure 5:
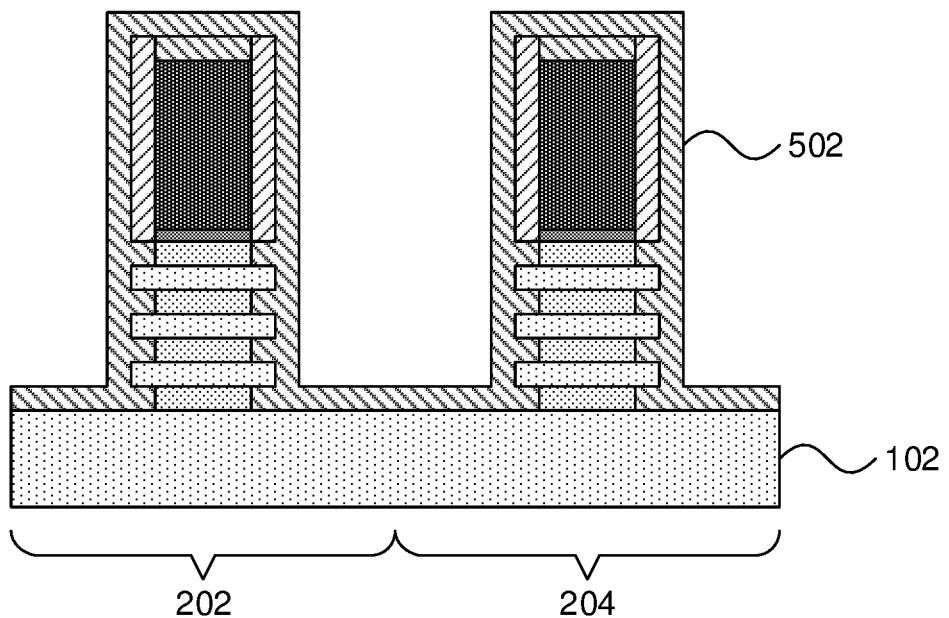
FIG. 5 is a cross-sectional view of a step in a method of forming nanosheet devices that employ inner spacers with varying materials, to tune the threshold voltage of the device, that shows forming a first dielectric material in the recesses in accordance with an embodiment of the present invention.

Referring now to FIG. 5, a cross-sectional diagram of a step in forming nanosheet FETs having different threshold voltages is shown. A layer of dielectric material 502 is conformally deposited over the first region 202 and the second region 204. It is specifically contemplated that the dielectric layer 502 can be formed from silicon nitride, but it should be understood that any appropriate non-oxide dielectric material can be used instead if it has etch selectivity with respect the spacers 304. The present embodiments will be described with specific focus on an example where the dielectric layer 502 is formed from silicon nitride. In one particular example, the dielectric layer 502 can be formed with a thickness of about 9 nm.

Figure 6:
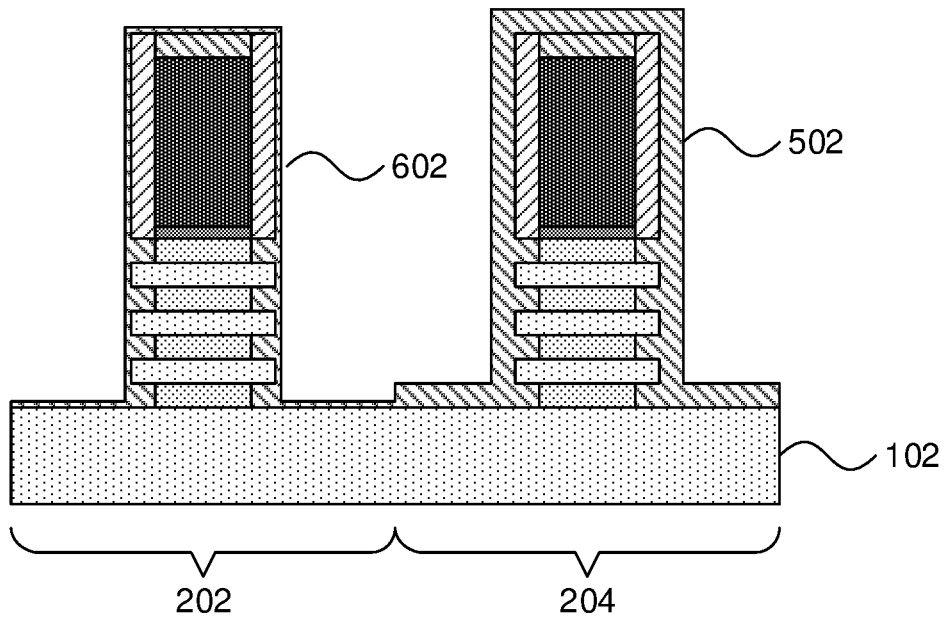
FIG. 6 is a cross-sectional view of a step in a method of forming nanosheet devices that employ inner spacers with varying materials, to tune the threshold voltage of the device, that shows etching back the first dielectric material in a first device region in accordance with an embodiment of the present invention.

Referring now to FIG. 6, a cross-sectional diagram of a step in forming nanosheet FETs having different threshold voltages is shown. The dielectric layer 502 is partially etched back in the first region 202, for example by masking the second region 204 and applying an isotropic etch to the exposed dielectric material. This produces a thinned dielectric layer 602 in the first region 202.

Figure 7:
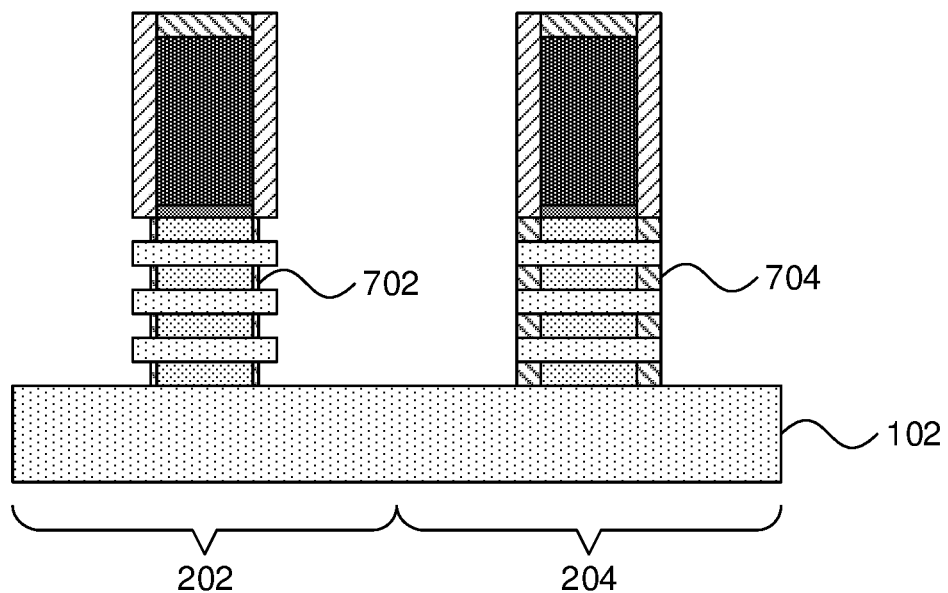
FIG. 7 is a cross-sectional view of a step in a method of forming nanosheet devices that employ inner spacers with varying materials, to tune the threshold voltage of the device, that shows etching back the first dielectric material in all device regions in accordance with an embodiment of the present invention.

Referring now to FIG. 7, a cross-sectional diagram of a step in forming nanosheet FETs having different threshold voltages is shown. The material of the dielectric layer 502 and the thinned dielectric layer 702 are etched back using a timed isotropic etch. In one specific example, where the dielectric layer was formed with a thickness of about 9 nm, the etch removes about 9 nm of material. In the first region 202, this produces first inner spacer sub-layer 702. In the second region 204, this produces second inner spacers 704 that fill the recesses at the etches sacrificial layers 402.

Figure 8:
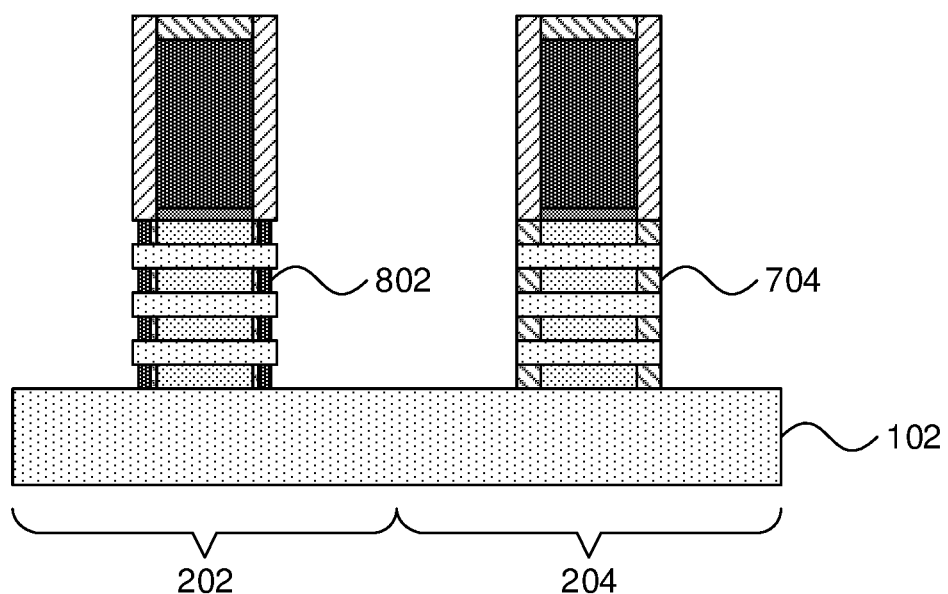
FIG. 8 is a cross-sectional view of a step in a method of forming nanosheet devices that employ inner spacers with varying materials, to tune the threshold voltage of the device, that shows the formation of a second dielectric material in the recesses of the first device region in accordance with an embodiment of the present invention.

Referring now to FIG. 8, a cross-sectional diagram of a step in forming nanosheet FETs having different threshold voltages is shown. A second inner spacer sub-layer 802 is formed in the first region 202 by conformally depositing a second dielectric material and then etching back. It is specifically contemplated that the second inner spacer sub-layer 802 can be formed from silicon dioxide if the first inner spacer sub-layer 702 is formed from silicon nitride or some other dielectric. In some embodiments, the second inner spacer sub-layer 802 is recessed relative to the sidewalls of the channel layers 106, while in other embodiments the second inner spacer sub-layer 802 is flush with the sidewalls of the channel layers 106. The second inner spacer sub-layer 802 provides protection during subsequent epitaxial growth processes.

Figure 9:
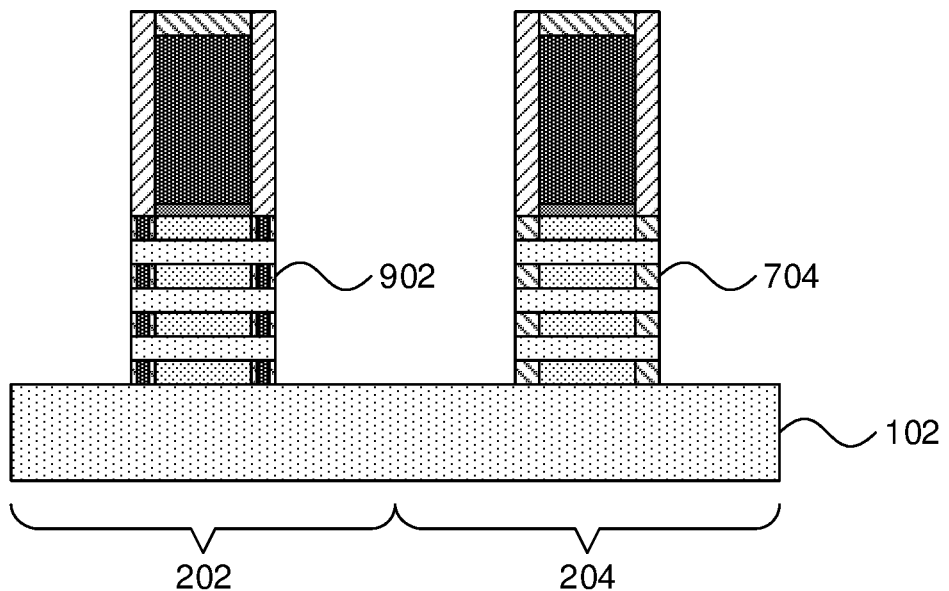
FIG. 9 is a cross-sectional view of a step in a method of forming nanosheet devices that employ inner spacers with varying materials, to tune the threshold voltage of the device, that shows the formation of another layer of the first dielectric material in the recesses of the first device region in accordance with an embodiment of the present invention.

Referring now to FIG. 9, a cross-sectional diagram of a step in forming nanosheet FETs having different threshold voltages is shown. A third inner spacer sub-layer 902 is formed in the first region 202 by conformally depositing a third dielectric material and then etching back. It is specifically contemplated that the third dielectric material can match the material of the first inner spacer sub-layer 702 (e.g., silicon nitride), but it should be understood that any appropriate dielectric material can be used instead. The result is a set of three sub-layers, with an inner oxide sub-layer 802 being sandwiched between two selectively etchable outer sub-layers 702 and 902. In other embodiments, the third inner spacer sub-layer 902 can be omitted, with the recess instead being filled by the second inner spacer sub-layer 802.

Figure 10:
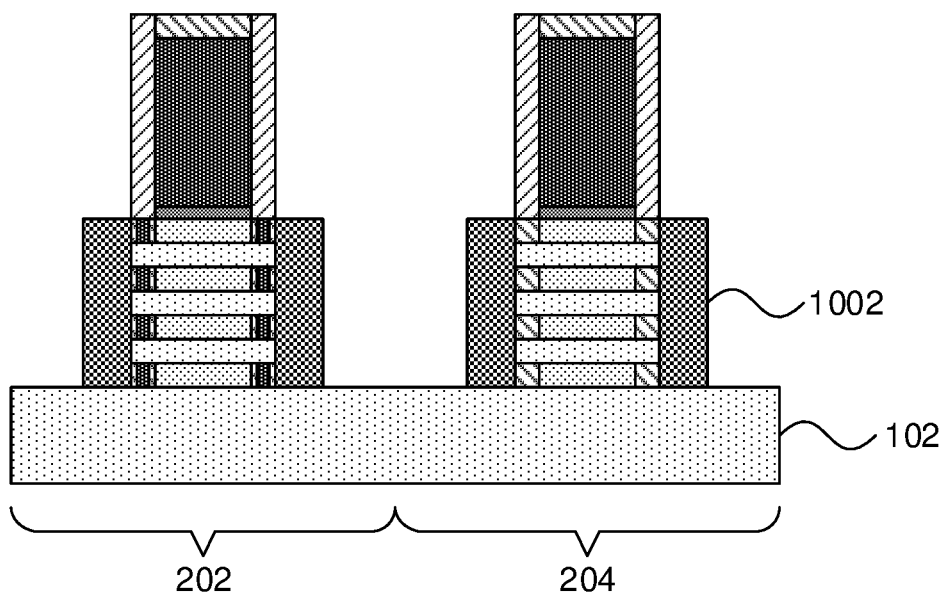
FIG. 10 is a cross-sectional view of a step in a method of forming nanosheet devices that employ inner spacers with varying materials, to tune the threshold voltage of the device, that shows the formation of source/drain structures in accordance with an embodiment of the present invention.

Referring now to FIG. 10, a cross-sectional diagram of a step in forming nanosheet FETs having different threshold voltages is shown. Source and drain regions 1002 are epitaxially grown from the exposed sidewalls of the channel layers 106. It is specifically contemplated that the source/drain regions 1002 can be formed from a same material as the channel layers 106 (e.g., silicon), but any material with a compatible crystal structure can be used instead. The source/drain regions 1002 can be doped with any appropriate n-type or p-type dopant, according to the design needs for the device, using in situ doping or ion bombardment.

Figure 11:
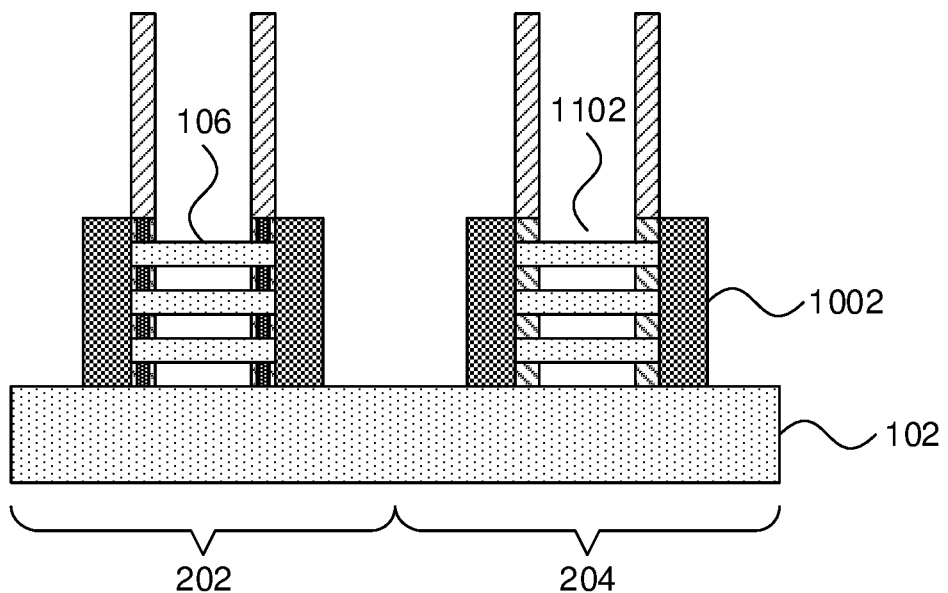
FIG. 11 is a cross-sectional view of a step in a method of forming nanosheet devices that employ inner spacers with varying materials, to tune the threshold voltage of the device, that shows the removal of sacrificial layers to release the channel layers in the stack in accordance with an embodiment of the present invention.

Referring now to FIG. 11, a cross-sectional diagram of a step in forming nanosheet FETs having different threshold voltages is shown. The dummy gate 208 is etched away, along with the dummy gate hardmask 210 and insulator pad 209. The etch of the dummy gate structures can be performed by one or more isotropic or anisotropic etches. The sacrificial layers 104 are etched away using a selective isotropic etch that removes sacrificial material from between the channel layers 106, exposing the top and bottom surfaces of the channel layers 106. A gap 1102 remains.

Figure 12:
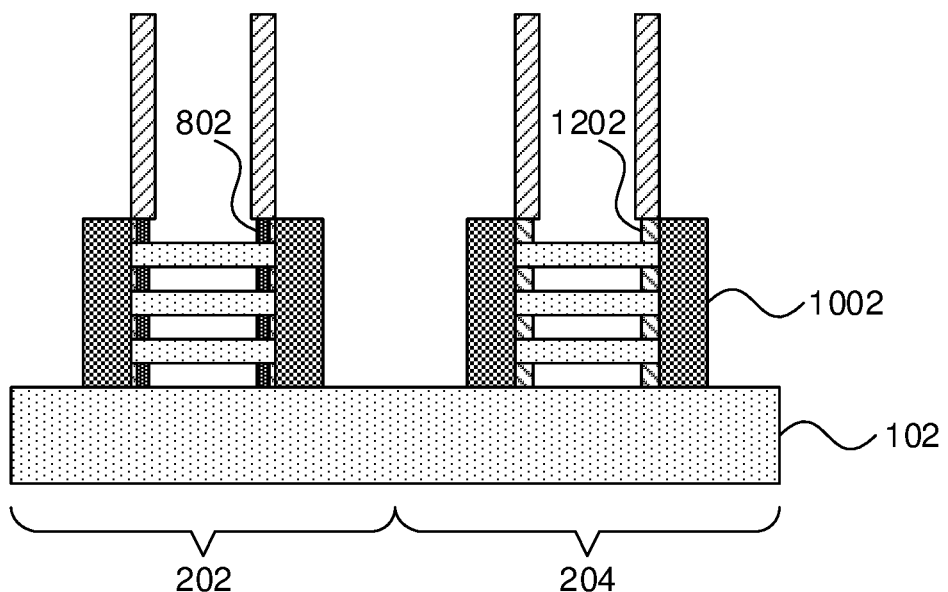
FIG. 12 is a cross-sectional view of a step in a method of forming nanosheet devices that employ inner spacers with varying materials, to tune the threshold voltage of the device, that shows the removal of material of the inner spacers in accordance with an embodiment of the present invention.

Referring now to FIG. 12, a cross-sectional diagram of a step in forming nanosheet FETs having different threshold voltages is shown. A timed, selective, isotropic etch is used to remove material from the first inner spacer sub-layer 702 and from the second inner spacers 704. The first inner spacer sub-layer 702 is removed entirely, exposing the second inner spacer sub-layer 802, while the second inner spacers 704 are merely thinned.

Figure 13:
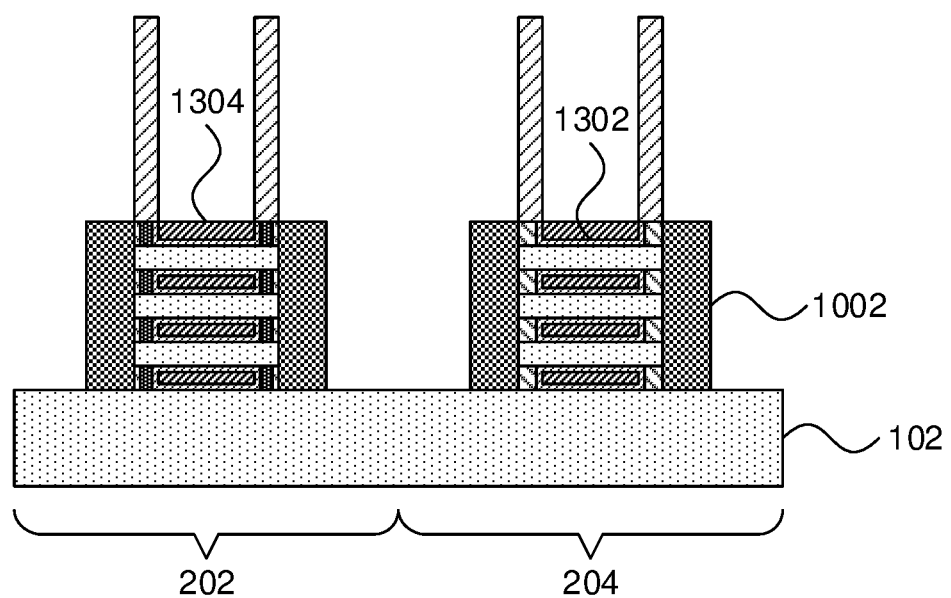
FIG. 13 is a cross-sectional view of a step in a method of forming nanosheet devices that employ inner spacers with varying materials, to tune the threshold voltage of the device, that shows the formation of a gate stack in accordance with an embodiment of the present invention.

Referring now to FIG. 13, a cross-sectional diagram of a step in forming nanosheet FETs having different threshold voltages is shown. A gate stack is formed on, between, and around the channel layers 106. The gate stack includes a gate dielectric 1302 and a gate conductor 1304, with the optional inclusion of a work function metal (not shown) that adjusts the threshold voltage of the device. The work function metal can itself play the role of the gate conductor 1304 or can form an additional layer between the gate conductor 1304 and the gate dielectric 1302.

It is specifically contemplated that the gate dielectric 1302 can be formed from a high-k dielectric material, which is a material that has a dielectric constant that is greater than the dielectric constant of silicon dioxide. Hafnium dioxide is specifically contemplated, but other examples of high-k dielectric materials include but are not limited to metal oxides such as hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as lanthanum and aluminum.

As used herein, a "p-type work function metal layer" is a metal layer that effectuates a p-type threshold voltage shift. In one embodiment, the work function of the p-type work function metal layer ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero. In one embodiment, a p-type work function metal layer may be formed from titanium nitride, titanium aluminum nitride, ruthenium, platinum, molybdenum, cobalt, and alloys and combinations thereof.

As used herein, an "n-type work function metal layer" is a metal layer that effectuates an n-type threshold voltage shift. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In one embodiment, the work function of the n-type work function metal layer ranges from 4.1 eV to 4.3 eV. In one embodiment, the n-type work function metal layer is formed from at least one of titanium aluminum, tantalum nitride, titanium nitride, hafnium nitride, hafnium silicon, or combinations thereof. It should be understood that titanium nitride may play the role of an n-type work function metal or a p-type work function metal, depending on the conditions of its deposition.

The gate conductor 1304 can be formed from any appropriate conductive metal such as, e.g., tungsten, aluminum, nickel, titanium, molybdenum, tantalum, copper, platinum, silver, gold, ruthenium, iridium, rhenium, rhodium, and alloys thereof. The gate conductor 1304 can alternatively be formed from a doped semiconductor material such as, e.g., doped polysilicon.

The above examples are described with respect to an example where the second inner spacers 704 are formed from silicon nitride and where the second inner spacer sub-layer 802 is formed from silicon dioxide. In these embodiments, the contact between the silicon dioxide of the second inner spacer sub-layer 802 and the gate dielectric 1302 in the first region 202 lowers the threshold voltage of the device in the first region 202 if that device is a p-type FET and raises the threshold voltage of the device if that device is an n-type FET, relative to the threshold voltage of a similar device in the second region 204.

Once the gate stack has been formed, additional steps can be performed to finish the devices. For example, an interlayer dielectric can be deposited and the spacers 304 can be polished down using, e.g., a chemical mechanical planarization process. Conductive contacts can be formed through the interlayer dielectric to make contact with the source/drain regions 1002 and the gate conductor 1304.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 14:
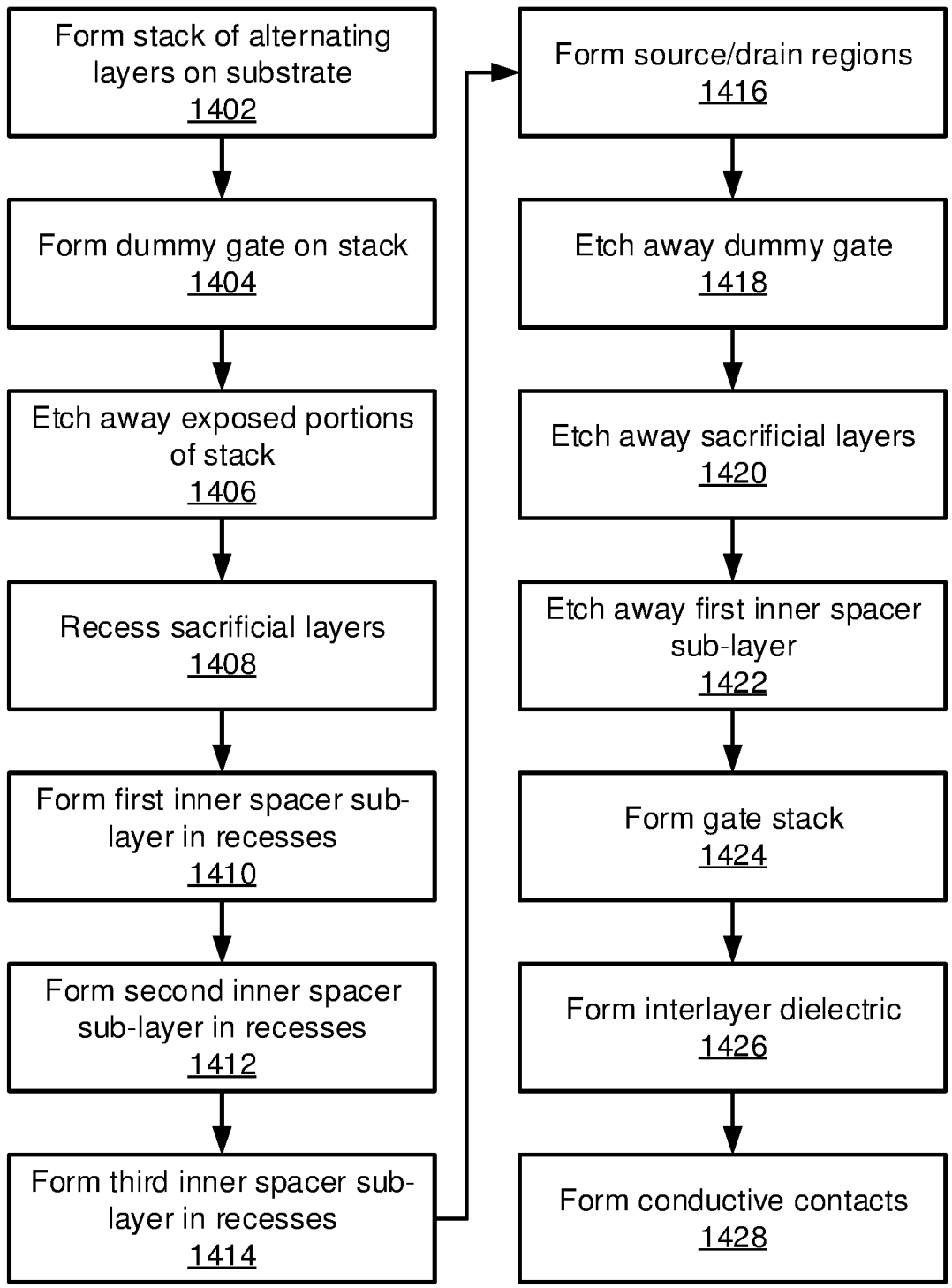
FIG. 14 is a block/flow diagram of a method of forming nanosheet devices that employ inner spacers with varying materials in accordance with an embodiment of the present invention.

Referring now to FIG. 14, a method of forming a semiconductor device is shown. Block 1402 forms a stack 108 of alternating sacrificial layers 104 and channel layers 106 by any appropriate process (e.g., sequential epitaxial growth processes). Block 1404 forms a dummy gate 208 on the stack 108, along with spacers 304. Block 1406 etches away the exposed portions of the stack 108 using an anisotropic etch process, for example alternating selective etch processes until the last layer is removed.

Block 1408 recesses the sacrificial layers 104 using, e.g., a timed isotropic etch. Block 1410 forms first inner spacer sub-layer 702 in the recesses. This can be performed by conformally depositing a dielectric material and then isotropically etching the deposited material back, so that only a portion remains within the recesses. Block 1412 similarly forms second inner spacer sub-layer 802 in the recesses. Block 1414 similarly forms third inner spacer sub-layer 902 in the recesses. It is specifically contemplated that the materials of the first and second inner spacer sub-layers can be selectively etchable with respect to one another. The inner spacer sub-layers can be formed by conformally depositing a respective layer of material that fills the recesses and then etching back.

Block 1416 forms the source/drain regions 1002 by epitaxial growth from sidewalls of the channel layers 106. Block 1418 etches away the dummy gate 208 and block 1420 etches away the sacrificial layers 104. Block 1422 etches away the first inner spacer sub-layer 702, exposing a sidewall of the second inner spacer sub-layer 802.

Block 1424 forms a gate stack on the exposed channel layers 106, including a gate dielectric 1302 and a gate conductor 1304, as well as an optional work function metal layer. The gate dielectric 1302 is in contact with an oxide material of the second inner spacer sub-layer 802. Block 1426 forms an interlayer dielectric and block 1428 forms conductive contacts to the source/drain regions 1002 and to the gate conductor 1304 to finish the device.

Although FIG. 14 is shown with respect to the fabrication of a single device in a single region, it can readily be extended to forming multiple devices of the same kind and, furthermore, to forming devices having different structures and properties. In particular, devices in a second region 204 can be fabricated without the inner spacer sub-layer structures by filling the recesses in block 1410 and then masking the second region 204 before that material is etched back to form the first inner spacer sub-layer 702 in the first region 202. The mask can then be removed, as the subsequent sub-layer formation steps in blocks 1412 and 1414 will not leave any additional material in the already-full recesses of the second region 204.

Having described preferred embodiments of threshold voltage adjustment by inner spacer material selection (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a semiconductor device, comprising:
    forming first recesses in a first stack of alternating sacrificial layers and channel layers;
    forming a first inner spacer sub-layer in the first recesses from a first dielectric material;
    forming a second inner spacer sub-layer in the first recesses from a second dielectric material, different from the first dielectric material;
    replacing the sacrificial layers and the first inner spacer sub-layer with a gate stack in contact with the second inner spacer sub-layer.

2. The method of claim 1, further comprising forming a third inner spacer sub-layer in the first recesses.

3. The method of claim 2, wherein the third inner spacer sub-layer is formed from the first dielectric material.

4. The method of claim 1, wherein the first dielectric material is silicon nitride and the second dielectric material is silicon dioxide.

5. The method of claim 1, further comprising forming second recesses in a second stack of alternating sacrificial layers and channel layers, wherein forming the first inner spacer sub-layer in the first recesses comprises a deposition process that deposits the first dielectric material in the first recesses and the second recesses.

6. The method of claim 5, further comprising masking the second stack after the deposition process.

7. The method of claim 6, further comprising etching the first dielectric material on the first stack with a first timed etch process after masking the second stack.

8. The method of claim 7, further comprising unmasking the second stack and etching the first dielectric material on the first stack and the second stack with a second timed etch process.

9. An integrated chip, comprising:
a first semiconductor device, comprising:
first inner spacers between respective pairs of first channel layers, formed from a single layer of a first dielectric material; and
a first gate stack in contact with the first channel layers and the first inner spacers; and
a second semiconductor device, comprising:
second inner spacers between respective pairs of second channel layers, each inner spacer including an inner layer formed from a second dielectric material and an outer layer formed from the first dielectric material; and
a second gate stack in contact with the second channel layers and the inner layers of the second inner spacers.

10. The integrated chip of claim 9, wherein the second dielectric material is silicon dioxide and the first dielectric material is silicon nitride.

11. The integrated chip of claim 9, wherein the first inner spacers completely fill a space defined by side surfaces of the first channel layers and adjacent side surfaces of the first gate stack.

12. The integrated chip of claim 9, wherein the first and second semiconductor devices each further comprise gate sidewalls over a topmost set of respective inner spacers.

13. The integrated chip of claim 9, wherein the first semiconductor device comprises first top spacers that extend over the first inner spacers and a portion of the first gate stack and wherein the second semiconductor device comprises second top spacers that extend over the second inner spacers and a portion of the second gate stack.

14. The integrated chip of claim 9, wherein the inner layers are in direct contact with the gate stack and the outer layers, and wherein the outer layers are in direct contact with a source/drain structure.

* * * * *